US012720707B2

(12) United States Patent
Varrey et al.

(10) Patent No.: US 12,720,707 B2
(45) Date of Patent: Aug. 25, 2026

(54) FLUID RESERVOIR DEVICE FOR COMPUTING SYSTEM

(71) Applicant: AMD Design, LLC, Wilmington, DE (US)

(72) Inventors: Mahesh Varrey, Clifton, NJ (US); Chen An, Bergenfield, NJ (US)

(73) Assignee: AMD DESIGN, LLC, Wilmington, DE (US)

( * ) Notice: Subject to any disclaimer, the term of this patent is extended or adjusted under 35 U.S.C. 154(b) by 336 days.

(21) Appl. No.: 18/515,436

(22) Filed: Nov. 21, 2023

(65) Prior Publication Data

US 2025/0169033 A1 May 22, 2025

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
CPC .................................................. H05K 7/20272
USPC .......................................................... 361/699
See application file for complete search history.

(56) References Cited

U.S. PATENT DOCUMENTS 7,380,409 B2 * 6/2008 Campbell .......... H05K 7/20772 165/80.4
7,983,040 B2 * 7/2011 Campbell .......... H05K 7/20236 174/15.1
8,113,009 B2 * 2/2012 Kuriyama ............. F25B 47/006 361/696
8,336,922 B2 * 12/2012 Tiberghien .............. F16L 39/00 137/594
8,611,083 B2 * 12/2013 Kumlin ..................... G06F 1/20 361/699
9,351,428 B2 * 5/2016 Eckberg .................. F16L 37/34
9,375,988 B2 * 6/2016 Huegerich ............... B60D 1/62
9,417,011 B2 * 8/2016 Burgers ................ F28F 9/0258
10,164,373 B1 * 12/2018 Cheon ................ H05K 7/20781
10,188,016 B2 * 1/2019 Lunsman ........... H05K 7/20263
10,288,198 B2 * 5/2019 Tiberghien ......... H05K 7/20272
10,405,458 B2 * 9/2019 Fukunaga .......... H05K 7/20272
10,701,838 B1 * 6/2020 Conroy .............. H05K 7/20781
10,921,070 B2 * 2/2021 Chen .................. H05K 7/20272
11,452,237 B2 * 9/2022 Tan .................... H05K 7/20272
11,553,627 B1 * 1/2023 Gregory ............. H05K 7/20781
11,877,428 B2 * 1/2024 Hogan ............... H05K 7/20781
11,892,252 B2 * 2/2024 Yang .................. H05K 7/20772
12,235,056 B1 * 2/2025 An ........................ F28F 9/0258

(Continued)

FOREIGN PATENT DOCUMENTS

WO WO-2007098077 A2 * 8/2007 ......... H05K 7/20727

*Primary Examiner* — Anatoly Vortman
(74) *Attorney, Agent, or Firm* — SCULLY, SCOTT, MURPHY & PRESSER, P.C.

(57) ABSTRACT

A fluid reservoir device is provided. A body forms a reservoir operable to receive fluid. The body is operable to transition between a contracted configuration and an expanded configuration such that the body in the expanded configuration expands a volume of the reservoir. A transition component is operable to transition the body between (1) the expanded configuration to the contracted configuration as a computing device fluidly connects with a rack manifold, and (2) the contracted configuration to the expanded configuration as the computing device disconnects from the rack manifold.

17 Claims, 13 Drawing Sheets

(56) References Cited

U.S. PATENT DOCUMENTS

| | | | | |
|---|---|---|---|---|
| 2011/0026225 | A1* | 2/2011 | Ostwald | H05K 7/20645 165/104.31 |
| 2011/0313576 | A1* | 12/2011 | Nicewonger | H05K 7/20781 361/701 |
| 2016/0270260 | A1* | 9/2016 | Franz | H05K 7/20781 |
| 2022/0338384 | A1* | 10/2022 | Hogan | H05K 7/20781 |
| 2023/0060854 | A1* | 3/2023 | Gao | H05K 7/20781 |
| 2023/0068535 | A1* | 3/2023 | Chen | G06F 1/20 |
| 2023/0114730 | A1* | 4/2023 | Sprenger | G06F 11/3006 165/11.1 |
| 2024/0224466 | A1* | 7/2024 | An | F16L 37/12 |
| 2024/0251529 | A1* | 7/2024 | McAnally | H05K 7/20172 |
| 2024/0341060 | A1* | 10/2024 | Gao | H05K 7/20781 |
| 2025/0056770 | A1* | 2/2025 | Chigullapalli | H05K 7/20272 |
| 2025/0344346 | A1* | 11/2025 | Yen | H05K 7/20263 |

* cited by examiner

FLUID RESERVOIR DEVICE FOR COMPUTING SYSTEM

FIELD

The present disclosure relates generally to a fluid reservoir device operable to prevent fluid overflow during ejection of a liquid cooled computing device from a rack manifold.

BACKGROUND

Computing devices are continually improving and becoming more powerful. The chips, for example artificial intelligence chips, are becoming more powerful, which leads to increased thermal design power. Liquid cooling is utilized to manage the heat generated by the chips.

BRIEF DESCRIPTION OF THE DRAWINGS

Implementations of the present technology will now be described, by way of example only, with reference to the attached figures, wherein.

DETAILED DESCRIPTION

Figure 1:
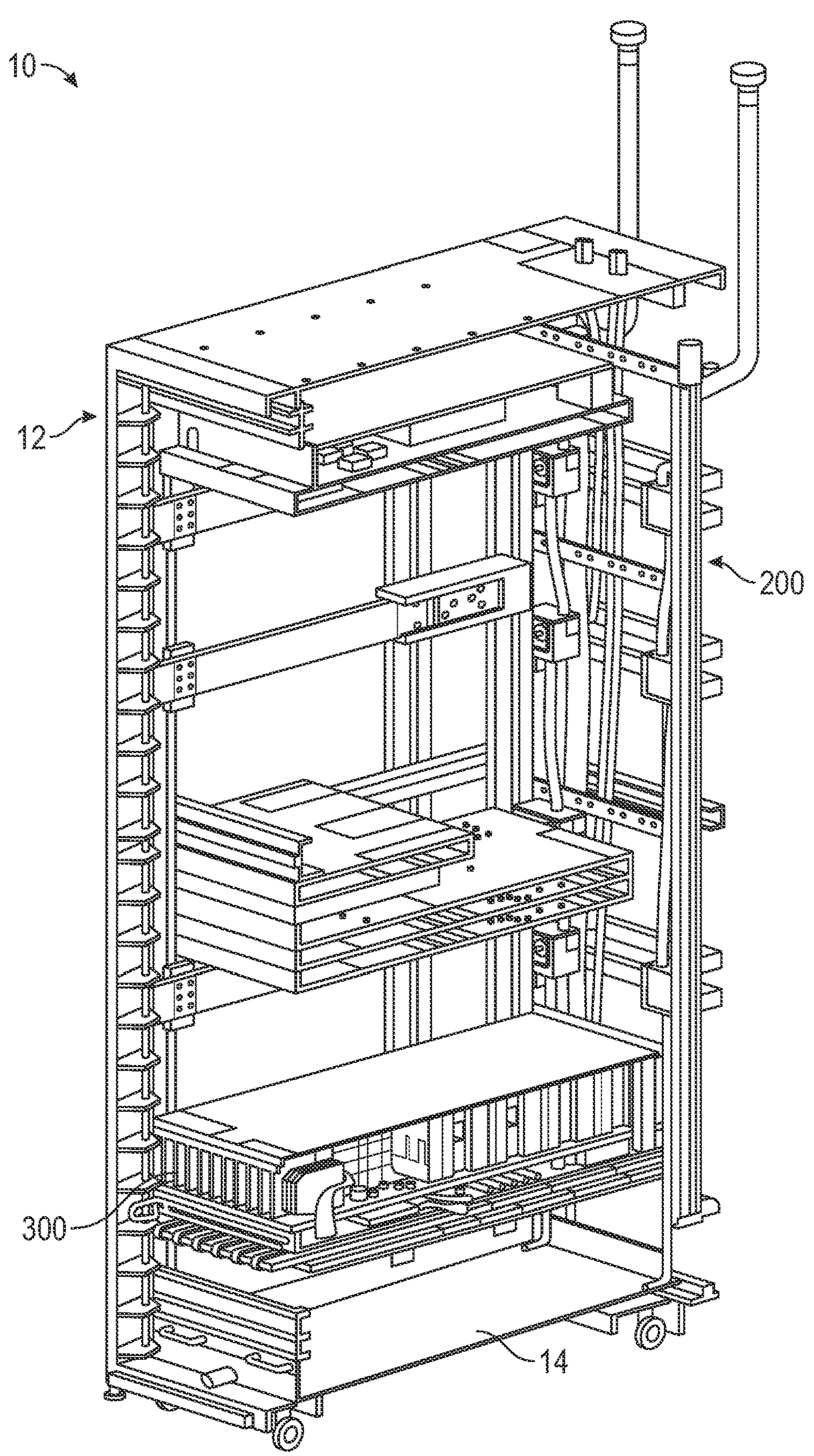
FIG. 1 illustrates a computing system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term “coupled” is defined as connected, whether directly or indirectly through intervening components, and is not necessarily limited to physical connections. The term “substantially” is defined to be essentially conforming to the particular dimension, shape or other word that substantially modifies, such that the component need not be exact. For example, substantially cylindrical means that the object resembles a cylinder, but can have one or more deviations from a true cylinder. The term “about” means reasonably close to the particular value. For example, about does not require the exact measurement specified and can be reasonably close. As used herein, the word “about” can include the exact number. The term “near” as used herein is within a short distance from the particular mentioned object. The term “near” can include abutting as well as relatively small distance beyond abutting. The terms “comprising,” “including” and “having” are used interchangeably in this disclosure. The terms “comprising,” “including” and “having” mean to include, but not necessarily be limited to the things so described.

Liquid cooled computing systems warrant the need for a leak containment and proper drain channels (both chassis and rack level) necessary to protect the expensive electronic equipment from fluid (e.g., water and/or coolant) damage.

The computing device can include a leak containment structure operable to catch and channel the leaking fluid to the bottom of the rack by using a gravity fed drain. The leak containment structure can include a graphics processing unit (GPU) channel and a central processing unit (CPU) channel around the cold plates that helps catch and channel the leaking fluid to the bottom of the rack. Since the leak containment structure relies on gravity, the leak containment structure (e.g., a fluid reservoir device) at the connection between the chassis of the computing device and the rack manifold can be operable to catch any residual fluid runoff after the chassis is disengaged from the rack manifold.

In the liquid cooling system, quick disconnects (e.g., computing quick disconnect and rack quick disconnect) can be utilized. In some examples, the quick disconnects can be blind mate quick disconnects for enhanced serviceability. The quick disconnects can have very quick ejection with high momentum that causes any residual fluid inside a leaking chassis to escape the drain path during chassis slide out as a gap is formed between the chassis reservoir and the rack splash guard, created during slide out (e.g., disconnection and separation between computing quick disconnect and rack quick disconnect). This fluid runoff needs to be contained to ensure there are little to no drips or spillage during slide out.

The fluid reservoir device provides a flexible volume inside a reservoir (e.g., the chassis reservoir). The fluid reservoir device can be operable to expand as the chassis is disconnected and provide increased volume to hold the residual fluid to avoid spillage.

The disclosure now turns to FIG. 1, which illustrates an example of a computing system 10 to be used, for example, with a liquid cooled modular server and/or information handling system. The computing system 10 can include a rack 12 with a rack manifold 200 and a computing device 300 configured to be received by the rack 12. The computing device 300 can be operable to fluidly couple with the rack manifold 200 such that fluid (e.g., water and/or coolant) for the liquid cooling system of the computing device 300 can flow throughout the computing system 10.

Figure 2A:
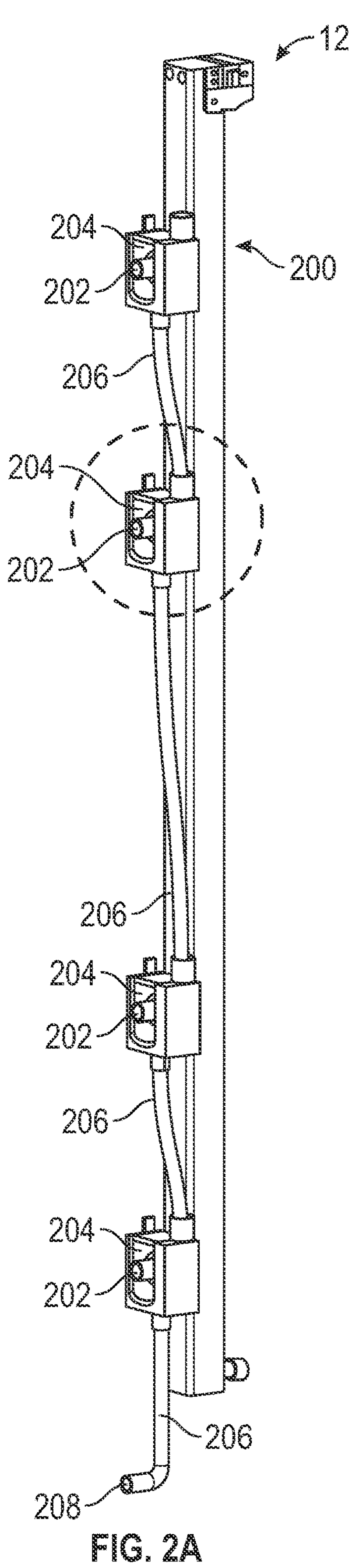
FIG. 2A illustrates a rack manifold for a liquid cooling system for a computing device in the computing system.
Figure 2B:
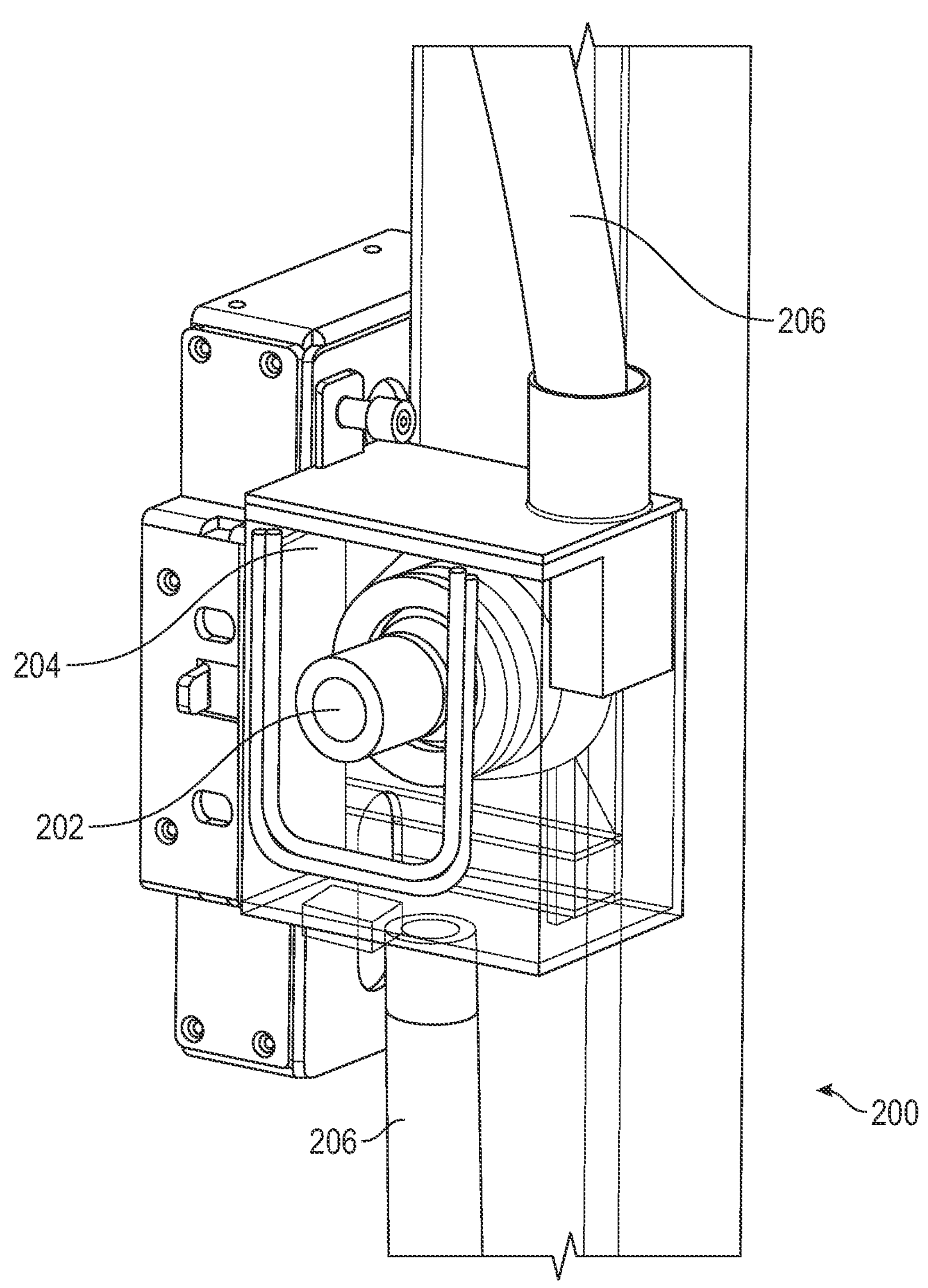
FIG. 2B illustrates an enlarged view of the rack manifold of FIG. 2A, showing a rack disconnect and rack splash guard.

FIGS. 2A and 2B illustrate the rack manifold 200. The rack manifold 200 can include one or more rack disconnects 202. The rack disconnects 202 can be operable to fluidly couple with a corresponding computing disconnect 370 (shown for example in FIG. 3A) of the computing device 300. In some examples, the rack disconnect 202 and the computing disconnect 370 can include quick disconnects. The quick disconnects can be blind mate quick disconnects for enhanced serviceability. The quick disconnects can have very quick ejection with high momentum that causes any residual fluid inside a leaking chassis to escape the drain path during chassis slide out as a gap is formed between the chassis reservoir 420 (as shown in FIG. 4A) and a rack splash guard 206, created during slide out (e.g., disconnection and separation between the computing disconnect 370 and the rack disconnect 202). The rack splash guard 204 can be operable to receive the fluid from the chassis reservoir 420 when the computing device 300 is connected with the rack manifold 200. This fluid runoff can be contained by the rack splash guard 204 to ensure there are little to no drips or spillage during slide out. The rack splash guard 204 can at least partially encompass the rack disconnect 202. As illustrated in FIG. 2A, the rack manifold 200 can include four rack disconnects 202 and corresponding rack splash guards 204. In other examples, different numbers of rack disconnects 202 and rack splash guards 204 can be included in the rack manifold 200 without deviating from the scope of the disclosure. The number of rack disconnects 202 and rack splash guards 204 can correspond with the number of computing disconnects 370 of the computing device(s) 300.

In at least one example, the rack splash guards 204 and/or the rack disconnects 202 can be fluidly coupled with one another in the rack manifold 200 via rack conduit(s) 206. The number of rack conduit(s) 206 can vary to fluidly couple the rack splash guards 204 and/or the rack disconnects 202. The rack conduits 206 can include, for example, tubing such that fluid can flow from one rack splash guard 204 to another rack splash guard 204. In at least one example, the rack conduit(s) 206 can fluidly couple the rack splash guards 204 in series. In some examples, the rack conduits 206 can fluidly connect a bottom of one rack splash guard 204 to a top of a subsequent splash guard 204 so that the fluid flows from one rack splash guard 204 to another through the rack conduit 206 via gravity force.

In at least one example, one or more of the rack conduits 206 can form a fluid exhaust 208. The fluid exhaust 208 can be operable to be in fluid communication with a drip pan 14. As shown in FIG. 1, the drip pan 14 can be received in the rack 12. The drip pan 14 can form a chamber operable to receive fluid from the rack manifold 200. For example, the rack splash guard 204 can be in fluid communication with the drip pan 14 via the fluid exhaust 208 of the rack conduit 206 such that the fluid received in the rack splash guard 204 is directed into the drip pan 14. Accordingly, the fluid that leaks from the computing system 10 that is captured by the rack splash guard(s) 204 can be received in the drip pan 14 for easy collection and disposal of the fluid.

Figure 3A:
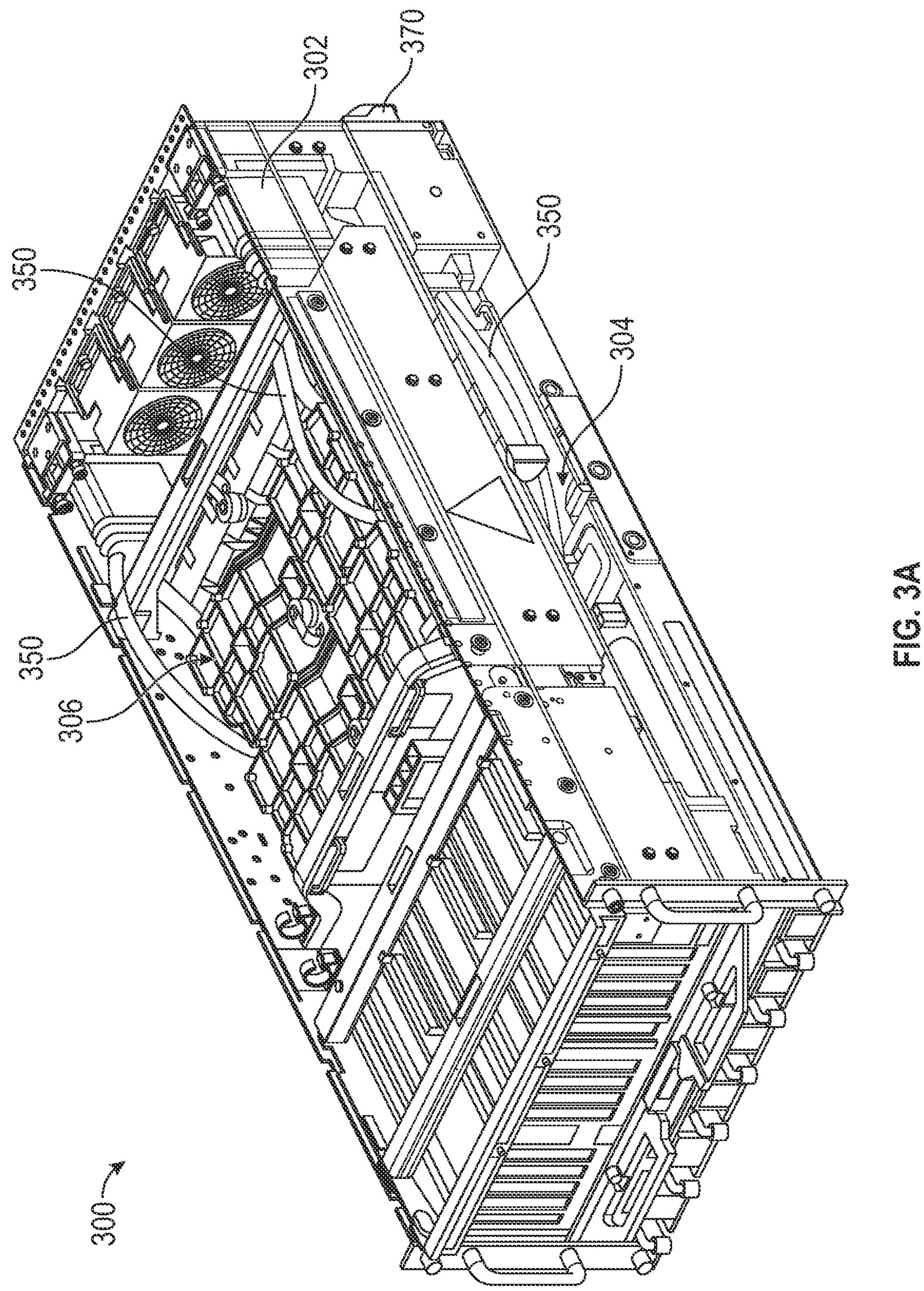
FIG. 3A illustrates a computing device.
Figure 3B:
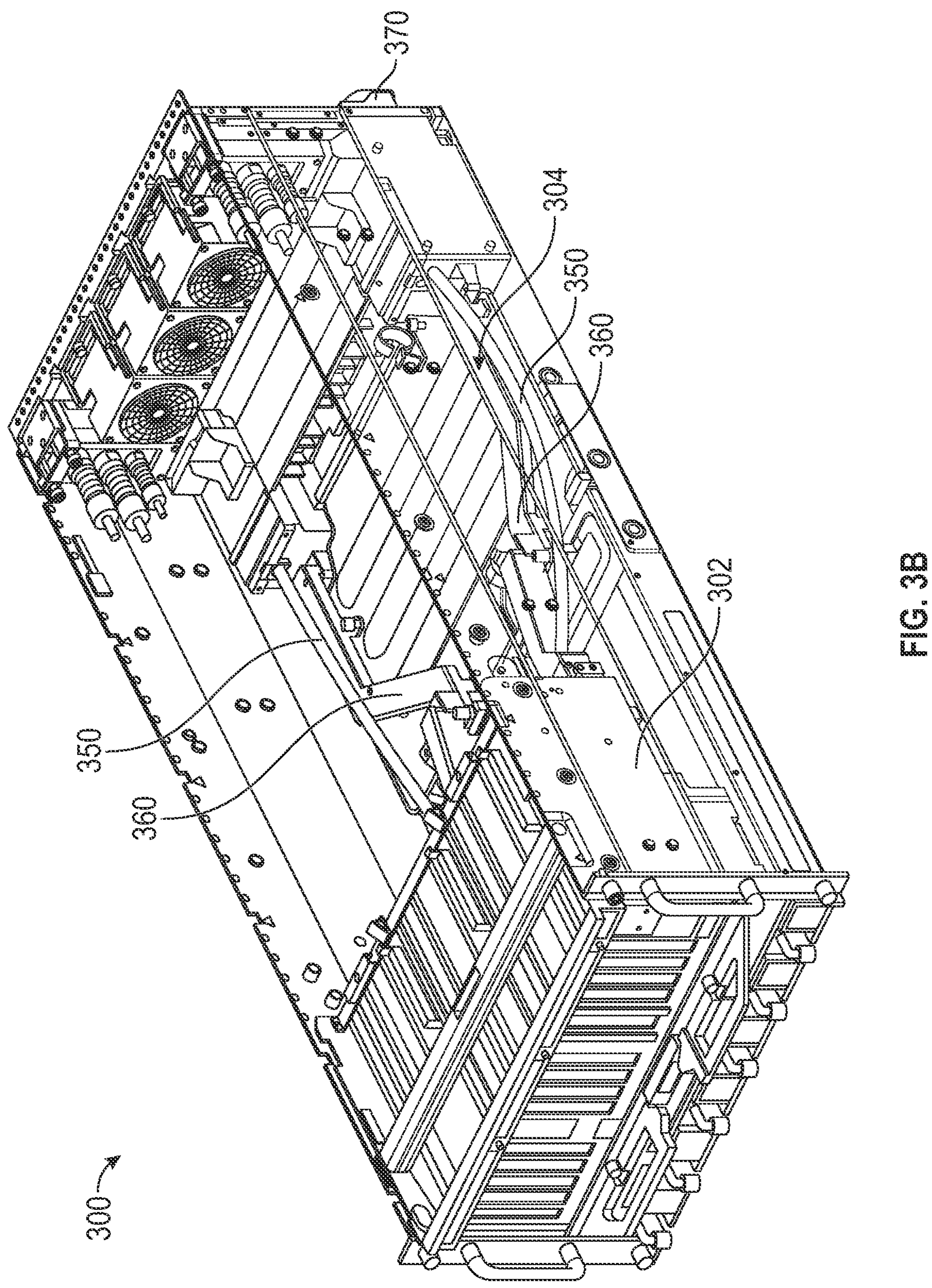
FIG. 3B illustrates the computing device of FIG. 3A, omitting a graphics processing unit (GPU) channel to show a chassis reservoir and central processing unit (CPU) channel.
Figures 4A, 4B:
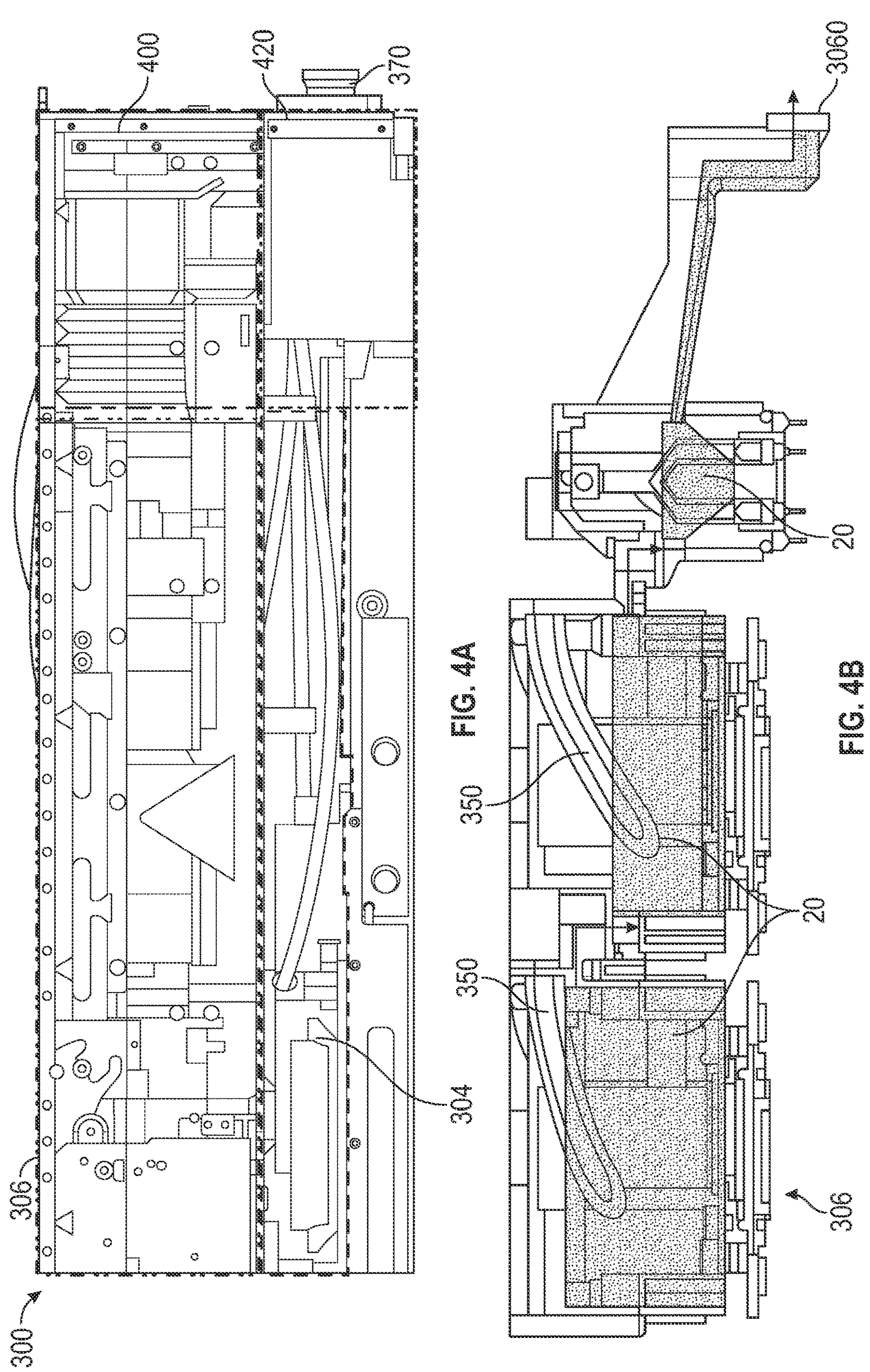
FIG. 4A illustrates a cross-sectional view of the computing device, showing the GPU channel, the CPU channel, a computing splash guard, and the chassis reservoir with a computing disconnect.
FIG. 4B illustrates a cross-sectional view of the GPU channel, showing the flow of fluid.

FIGS. 3A and 3B illustrate the computing device 300 that is operable to be received by the rack 12 and also be fluidly coupled with the rack manifold 200. The computing device 300 can include a chassis 302 operable to receive computing components such as one or more graphics processing units (GPU) and/or one or more central processing units (CPU). The computing device 300 can include a liquid cooling system 350 with a computing disconnect 370 operable to fluidly couple with the rack manifold 200 (e.g., via the rack disconnect 204). The liquid cooling system 350 can be operable to circulate fluid (e.g., water and/or coolant) to the GPUs and/or CPUs to control the temperature of the GPUs and/or CPUs to prevent overheating. The liquid cooling system 350 can be in fluid communication with the computing disconnect 370 so that the fluid flows between the rack manifold 200 and the liquid cooling system 350 via the fluid coupling of the computing disconnect 370 and the rack disconnect 204.

In at least one example, the computing device 300 can include a GPU channel 306 that is operable to receive the fluid in the chassis 302 leaking from the liquid cooling system 350 for the GPU and direct the fluid to the chassis reservoir 420 to be collected. In at least one example, the computing device 300 can include a CPU channel 304 (as shown in FIG. 3B) that is operable to receive the fluid in the chassis 302 leaking from the liquid cooling system 350 for the CPU and direct the fluid to the chassis reservoir 420 to be collected. For example, as shown in FIG. 3B, the CPU channel 304 can include one or more CPU drains 360 that are operable to direct the fluid leaking from the liquid cooling system 350 for the CPU towards the chassis reservoir 420 for collection.

FIGS. 4A, 4B, 4C, and 4D illustrate the computing device 300 including the GPU channel 306, the CPU channel 304, a computing splash guard 400, and the chassis reservoir 420. The computing device 300 is configured to direct fluid leaking from the liquid cooling system 350 inside the chassis 302 towards the chassis reservoir 420 for collection. Points of possible leakage are the CPU channel 304, the GPU channel 306, and the computing splash guard 400.

FIG. 4B illustrates the GPU channel 306 receiving leaked fluid 30 from the liquid cooling system 350. The GPU channel 306 directs the fluid 20 towards a GPU outlet 3060 to be deposited into the chassis reservoir 420. In at least one example, the GPU channel 306 can form one or more slopes such that the fluid 20 flows towards and out of the GPU outlet 3060 via gravity force.

Figure 4C:
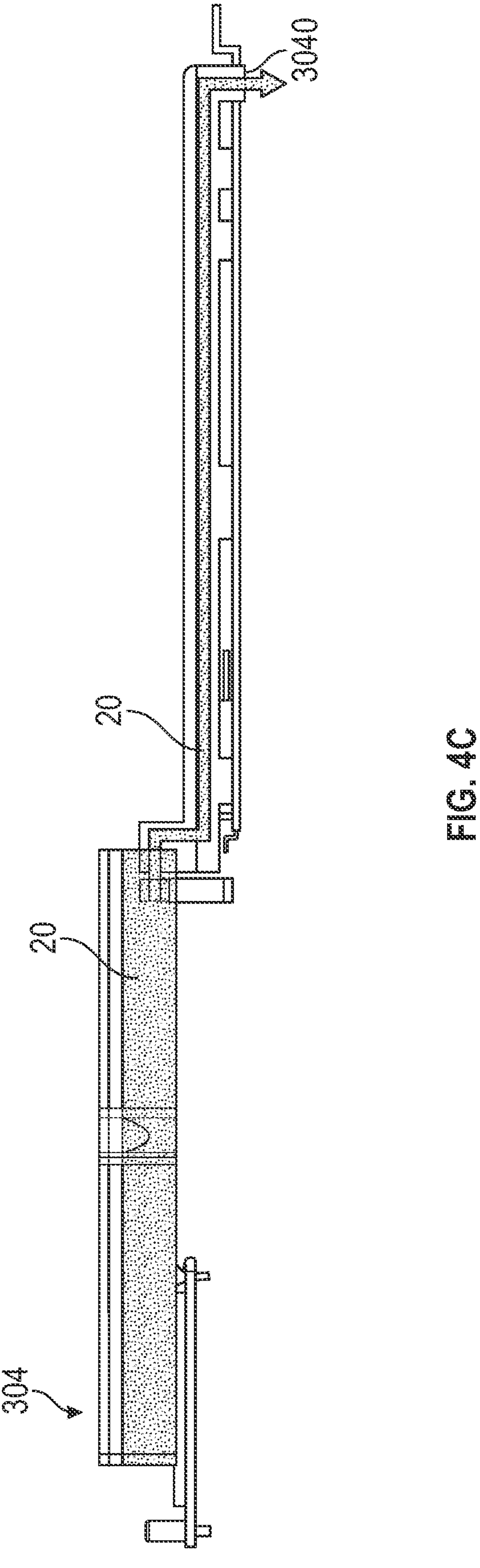
FIG. 4C illustrates a cross-sectional view of the CPU channel, showing the flow of fluid.

FIG. 4C illustrates the CPU channel 304. The CPU channel 304 is operable to direct the fluid 20 towards a CPU outlet 3040 to be deposited into the chassis reservoir 420. In at least one example, the CPU channel 304 can form one or more slopes such that the fluid 20 flows towards and out of the CPU outlet 3040 via gravity force.

Figures 4D, 5:
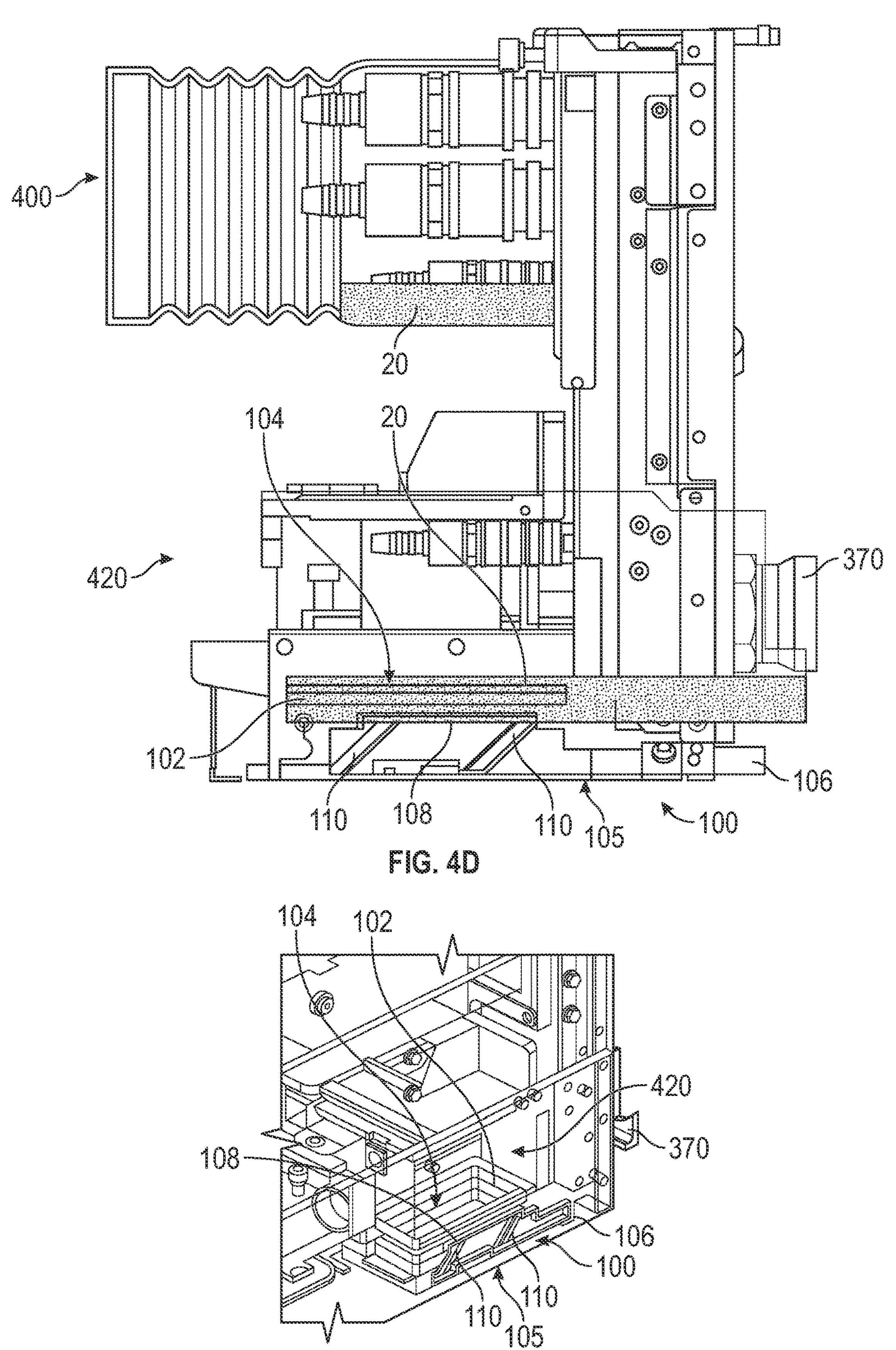
FIG. 4D illustrates the computing splash guard and the chassis reservoir, showing fluid retention therein.
FIG. 5 illustrates the computing device with the fluid reservoir device.
Figure 6A:
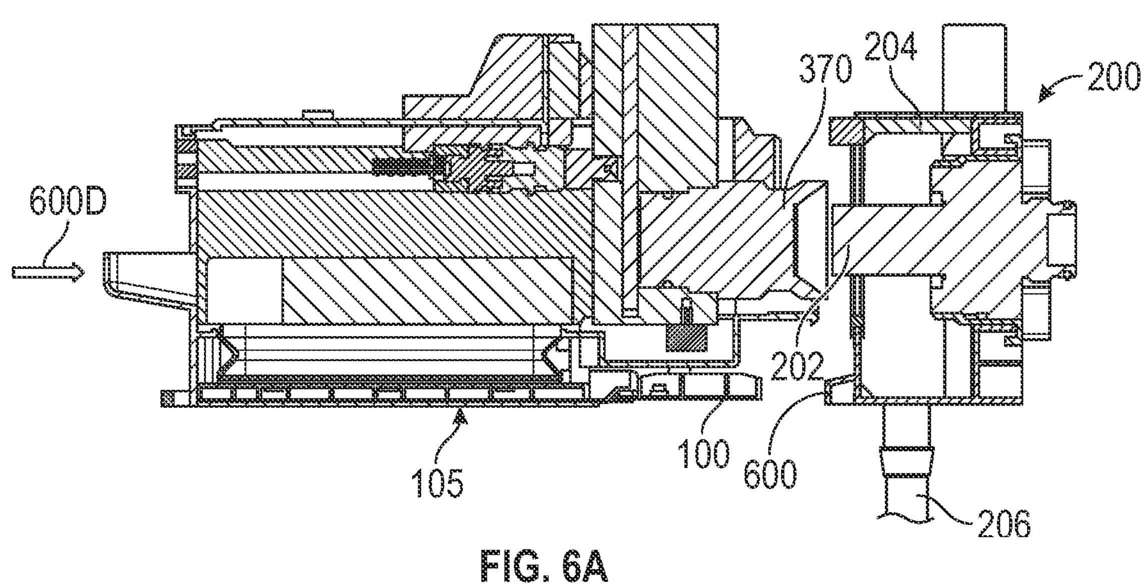
FIG. 6A illustrates the chassis reservoir with the fluid reservoir device and the computing disconnect translating to connect with the rack disconnect.
Figure 6B:
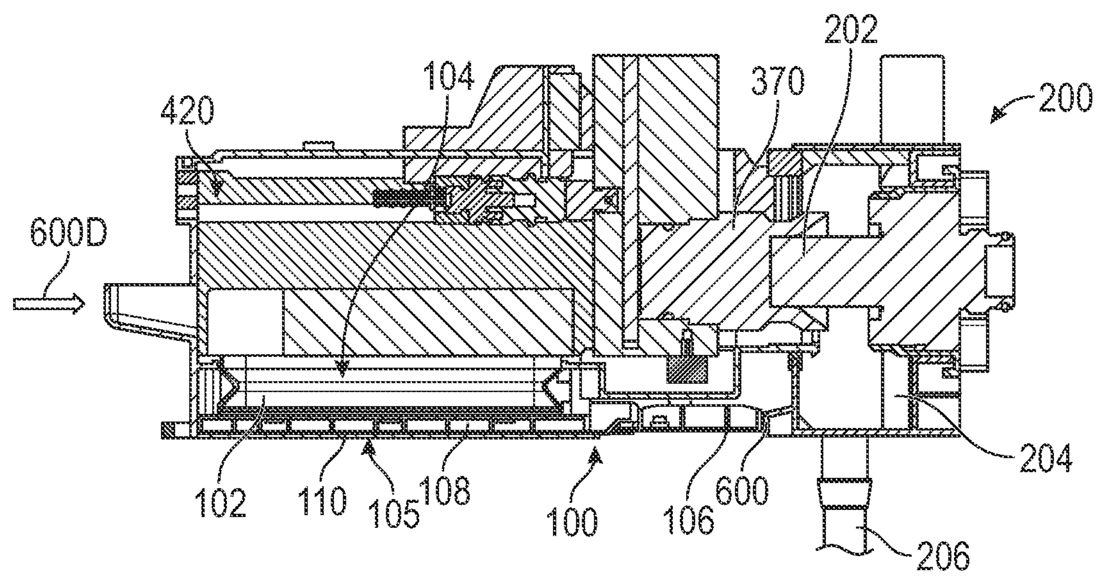
FIG. 6B illustrates the chassis reservoir with the fluid reservoir device and the computing disconnect connecting with the rack disconnect.
Figure 6C:
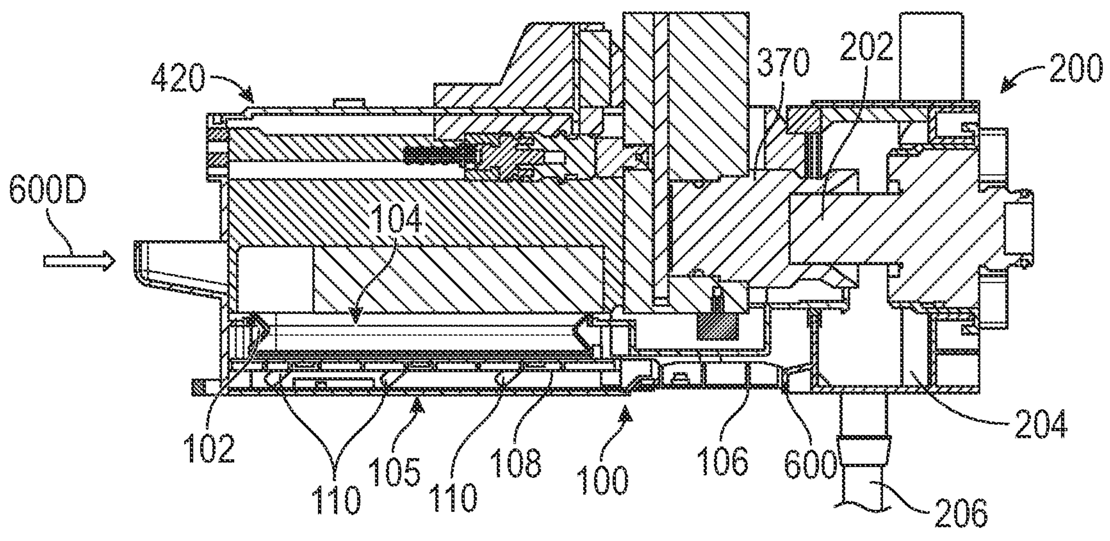
FIGS. 6C, 6D, and 6E illustrates the chassis reservoir with the fluid reservoir device transitioning towards a contracted configuration as the computing disconnect connects with the rack disconnect.
Figure 6D:
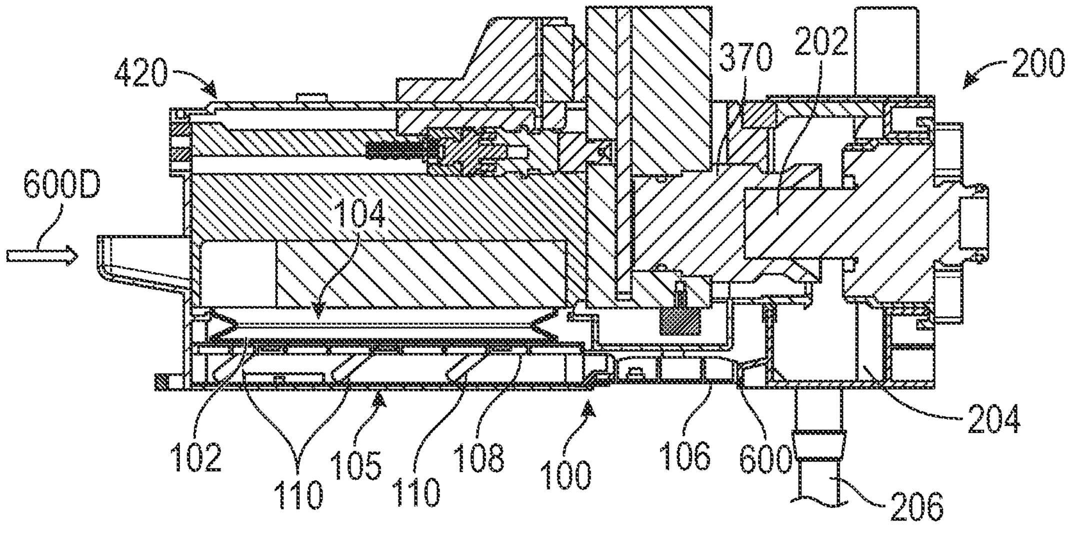
Figure 6E:
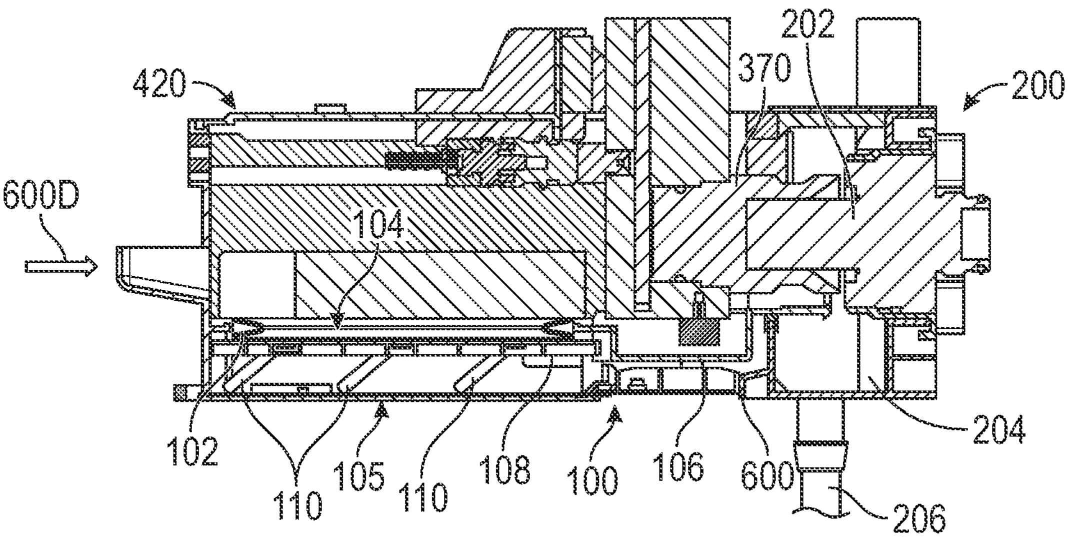

FIG. 4D illustrates the computing splash guard 400 and the chassis reservoir 420. The computing splash guard 400 is in fluid communication with the chassis reservoir 420 such that the fluid 20 is directed into the chassis reservoir 420. For example, the computing splash guard 400 can be positioned above the chassis reservoir 420 such that the fluid 20 flows from the computing splash guard 400 into the chassis reservoir 420 via gravity force.

The chassis reservoir 420 is operable to collect the leaking fluid in one space. However, to prevent fluid backflow during servicing, as shown in FIGS. 4D and 5, the computing device 300 can include a fluid reservoir device 100 in fluid communication with the chassis reservoir 420. The fluid reservoir device 100 can include a body 102 forming a reservoir 104 operable to receive fluid 20 in the chassis reservoir 420. The body 102 can be operable to be in fluid communication with the chassis reservoir 420 such that the fluid 20 in the chassis reservoir 420 flows into the reservoir 104. For example, as shown in FIGS. 4D and 5, the reservoir 104 can form at least a portion of a bottom surface of the chassis reservoir 420.

In at least one example, at least a portion of the body 102 can be made from a flexible material. In some examples, the flexible material can have a durometer 50 shore A. In at least one example, the fluid reservoir device 100 includes a bellows structure to permit expansion and contraction of the body 102 and the volume of the reservoir 104. In at least one example, the fluid reservoir device 100 can utilize static seals. In some examples, the fluid reservoir device 100 only utilizes static seals. Dynamic seals need tighter tolerances to function properly which can increase cost. Additionally dynamic seals require multiple parts which also can increase cost. In at least one example, the fluid reservoir device 100 can be a single part. For example, the fluid reservoir device 100 can be formed through two-shot molding which can decrease failure rate.

Figure 7:
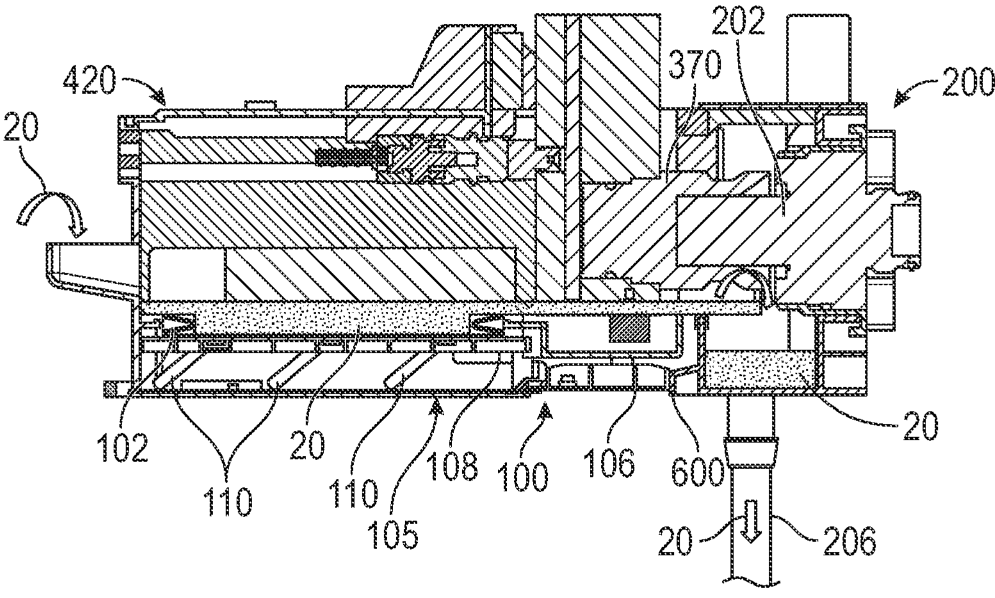
FIG. 7 illustrates the fluid reservoir device in the contracted configuration as fluid flows through the chassis reservoir, into the rack splash guard, and out of the rack splash guard.
Figure 8A:
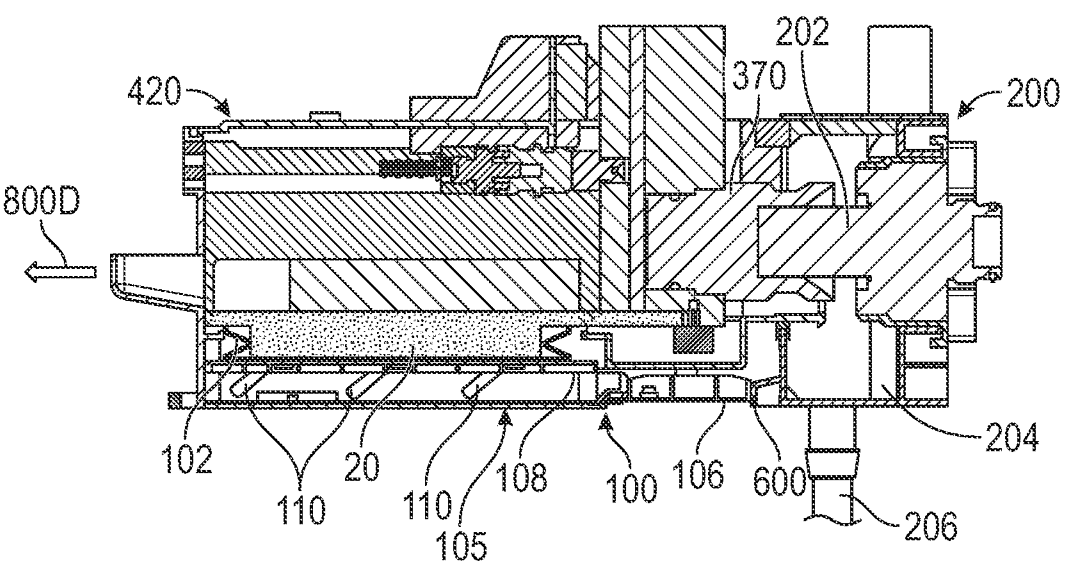
FIGS. 8A, 8B, 8C, and 8D illustrate the fluid reservoir device transitioning from the contracted configuration to an expanded configuration as the computing disconnect disconnects from the rack disconnect.
Figure 8B:
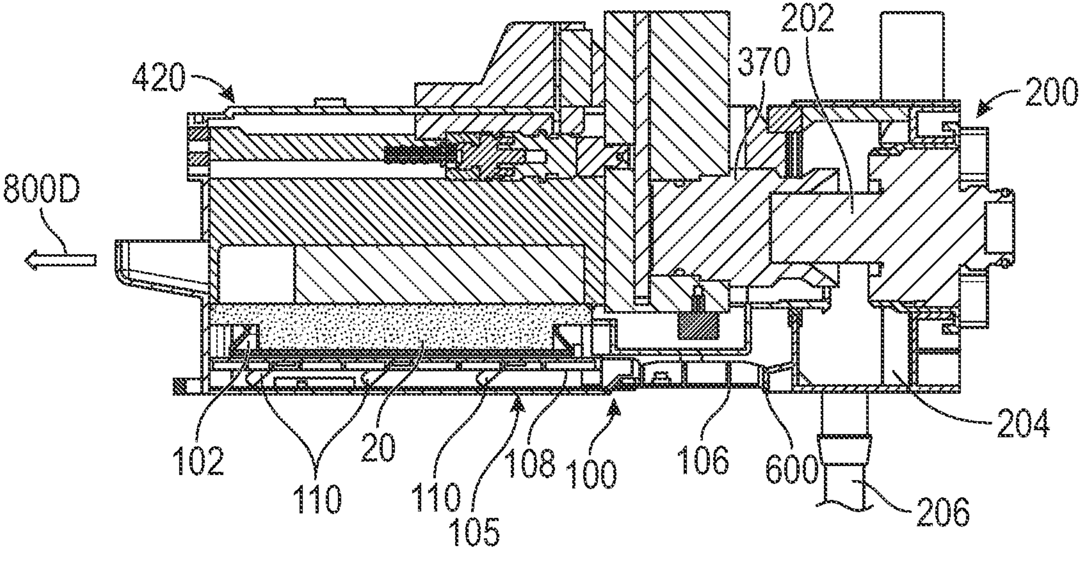
Figure 8C:
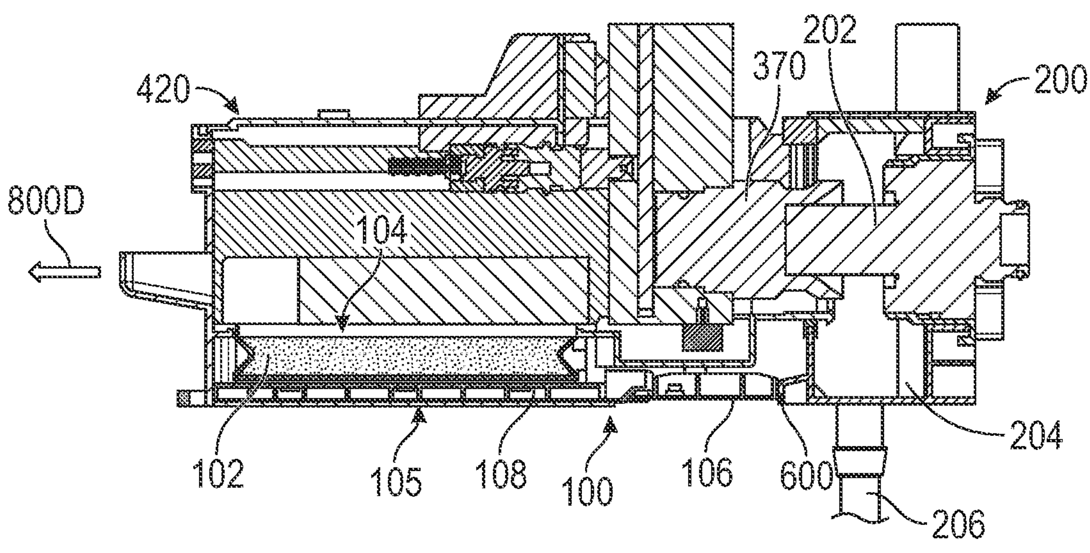
Figure 8D:
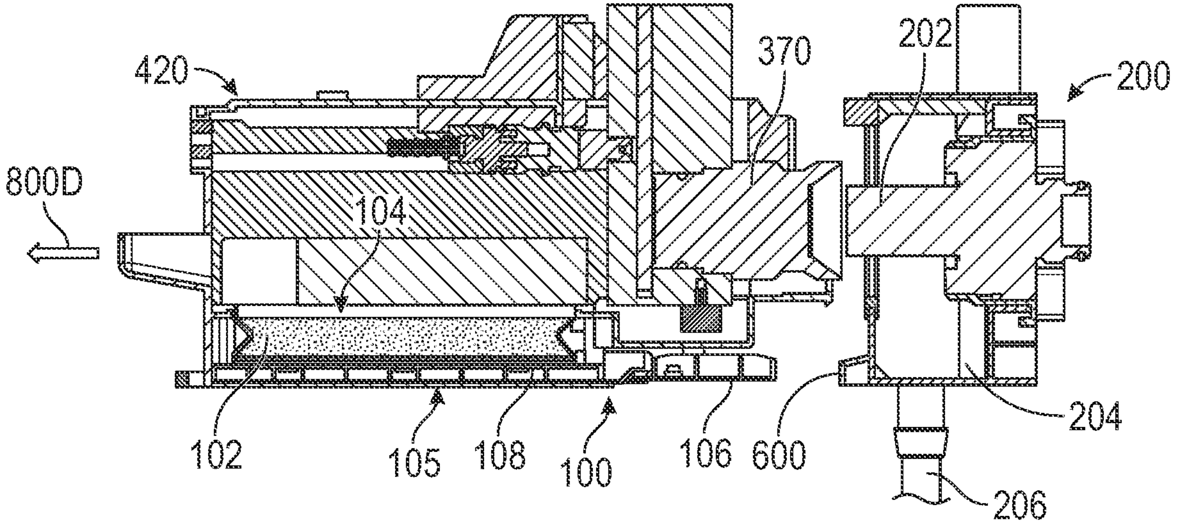

The body 102 can be operable to transition between a contracted configuration (as shown in FIG. 7) and an expanded configuration (as shown in FIG. 8D) such that the body 102 in the expanded configuration expands a volume of the reservoir 104. A transition component 105 can be operable to transition the body 102 between (1) the expanded configuration to the contracted configuration as the computing device 300 fluidly connects with the rack manifold 200 (see for example FIGS. 6A-6E), and (2) the contracted configuration to the expanded configuration as the computing device 300 disconnects from the rack manifold 200 (see for example FIGS. 8A-8D).

In at least one example, the transition component 105 includes a trigger slider 106 that is actuated as the computing device 300 is connected with the rack manifold 200 and is released as the computing device 300 is disconnected from the rack manifold 200. In some examples, the transition component 105 can be spring loaded such that only upon actuation of the trigger slider 106 does the body 102 transition to the contracted configuration. The transition component 105 is therefore user friendly as the transition component 105 is auto triggered by slide out action during disconnect between the computing device 300 and the rack manifold 200.

The transition component 105 can include a lift component 108, 110 that receives the body 102. The lift component 108, 110 can include a platform 108. The platform 108 can be operable to travel up and down to contract and expand the body 102 and the reservoir 104 volume. In at least one example, the lift component 108, 110 can include one or more legs 110 that are operable to move the platform 108 up and/or down as the trigger slider 106 translates.

For example, referring to FIGS. 6A-6E, the computing device 300 is being connected with the rack manifold 200 via the connection of the computing disconnect 370 and the rack disconnect 202. The computing device 300 is translated along direction 600D to bring the computing device 300 closer and to connect the computing device 300 to the rack manifold 200. As the computing disconnect 370 receives the rack disconnect 202, the trigger slider 106 abuts against an abutment surface 600 on the rack splash guard 204. In some examples, the abutment surface 600 can be a portion of the rack manifold 200, such as a portion of the rack disconnect 202, the rack splash guard 204, and/or the rack conduit 206. While FIGS. 6A-6E illustrate the computing disconnect 370 receiving the rack disconnect 202, in some examples, the rack disconnect 202 can be operable to receive the computing disconnect 370.

As the trigger slider 106 abuts against the abutment surface 600 and the computing disconnect 370 further receives the rack disconnect 202, the trigger slider 106 translates inwards (e.g., slides back into the computing device 300 opposite direction 600D) and is actuated. As the trigger slider 106 is actuated as the computing device 300 is connected with the rack manifold 200, the lift component 108, 110 is operable to compress the body 102 to transition the body 102 to the contracted configuration. For example, as illustrated in FIGS. 6A-6E, as the trigger slider 106 is actuated and slides inwards, the legs 110 raise to lift the platform 108. As the platform 108 raises, the body 102 of the fluid reservoir 100 compresses to the contracted configuration, and the volume of the reservoir 104 is decreased.

Referring to FIG. 7, when the computing device 300 is fully connected with the rack manifold 200, the chassis reservoir 420 is operable to receive leaked fluid 20 from the liquid cooling system 350 throughout the computing device 300. The body 102 of the fluid reservoir device 100 is in the contracted configuration, so the reservoir 104 has a smaller volume. The fluid 20 received in the chassis reservoir 420 can then flow out of the chassis reservoir 420 and into the rack splash guard 204. The fluid 20 then flows through the rack conduit(s) 206 towards the drip pan 16. Accordingly, any leaked fluid 20 is removed from the computing device 300 and drained from the computing system 10.

FIGS. 8A-8D illustrate the disconnection between the computing device 300 and the rack manifold 200. The computing device 300 is translated away from the rack manifold 200 along direction 800D such that the rack disconnect 202 is separated from the computing disconnect 370. Additionally, while the computing device 300 translates away from the rack manifold 200, the trigger slider 106 is released. When the trigger slider 106 is released as the computing device 300 is disconnected from the rack manifold 200, the lift component 108, 110 is operable to decompress the body 102 to transition the body 102 to the expanded configuration. For example, the trigger slider 106 translates back outwards from the computing device 300 (e.g., opposite direction 800D), and the legs 110 subsequently lower the platform 108. As the platform 108 is lowered, the body 102 expands to increase the volume of the reservoir 104. Accordingly, the reservoir 104 can then hold more fluid 20, and the fluid 20 is prevented from flowing out of the computing device 300 as it is received in the reservoir 104 of the body 102. Therefore, any residual fluid 20 runoff after the chassis 302 is disengaged from the rack manifold 200 is captured by the fluid reservoir device 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A fluid reservoir device comprising:

a body forming a reservoir operable to receive fluid, the body operable to transition between a contracted configuration and an expanded configuration such that the body in the expanded configuration expands a volume of the reservoir; and a transition component including a lift component coupled with the body and a trigger slider coupled with the lift component, the trigger slider being configured to be:

actuated via an abutment surface of a rack manifold as a computing device is connected with the rack manifold to cause the lift component to transition the body from the expanded configuration to the contracted configuration; and released as the computing device is disconnected from the rack manifold to cause the lift component to transition the body from the contracted configuration to the expanded configuration.

2. The fluid reservoir device of claim 1, wherein the body is operable to be in fluid communication with a chassis reservoir of the computing device such that the fluid in the chassis reservoir flows into the reservoir.

3. The fluid reservoir device of claim 1, wherein at least a portion of the body is made from a flexible material.

4. The fluid reservoir device of claim 3, wherein the flexible material has a durometer 50 shore A.

5. The fluid reservoir device of claim 1, wherein the fluid reservoir device includes a bellows structure.

6. The fluid reservoir device of claim 1, wherein the transition component includes a spring configured to bias the transition component towards releasing.

7. The fluid reservoir device of claim 1, wherein the abutment surface is disposed on a rack splash guard of the rack manifold.

8. A computing device comprising:

a liquid cooling system with a computing disconnect operable to fluidly couple with a rack manifold;

a chassis with a chassis reservoir operable to receive fluid leaking from the liquid cooling system; and a fluid reservoir device in fluid communication with the chassis reservoir, the fluid reservoir device including:

a body forming a reservoir operable to receive the fluid in the chassis reservoir, the body operable to transition between a contracted configuration and an expanded configuration such that the body transitioning to the expanded configuration expands a volume of the reservoir; and a transition component including a lift component coupled with the body and a trigger slider coupled with the lift component, the trigger slider being configured to be:

actuated via an abutment surface of the rack manifold as the computing device is connected with the rack manifold to cause the lift component to transition the body from the expanded configuration to the contracted configuration; and released as the computing device is disconnected from the rack manifold to cause the lift component to transition the body from the contracted configuration to the expanded configuration.

9. The computing device of claim 8, wherein at least a portion of the body is made from a flexible material.

10. The computing device of claim 9, wherein the flexible material has a durometer 50 shore A.

11. The computing device of claim 8, wherein the fluid reservoir device includes a bellows structure.

12. The computing device of claim 8, wherein the transition component includes a spring configured to bias the transition component towards releasing.

13. The computing device of claim 8, wherein the abutment surface is disposed on a rack splash guard of the rack manifold.

14. A computing system comprising:

a rack with a rack manifold including a rack disconnect and an abutment surface disposed proximate the rack disconnect; and a computing device including:

a liquid cooling system with a computing disconnect operable to detachably couple with the rack disconnect of the rack manifold to provide fluid communication between the rack manifold and the liquid cooling system;

a chassis with a chassis reservoir operable to receive fluid leaking from the liquid cooling system; and a fluid reservoir device in fluid communication with the chassis reservoir, the fluid reservoir device including:

a body forming a reservoir operable to receive the fluid in the chassis reservoir, the body operable to transition between a contracted configuration and an expanded configuration such that the body transitioning to the expanded configuration expands a volume of the reservoir; and a transition component including a lift component coupled with the body and a trigger slider coupled with the lift component, the trigger slider being configured to be:

actuated via the abutment surface of the rack manifold as the computing device is connected with the rack manifold to cause the lift component to transition the body from the expanded configuration to the contracted configuration; and released as the computing device is disconnected from the rack manifold to cause the lift component to transition the body from the contracted configuration to the expanded configuration.

15. The computing system of claim 14, wherein the rack manifold includes a rack splash guard operable to receive the fluid from the chassis reservoir when the computing device is connected with the rack manifold.

16. The computing system of claim 15, further comprising a drip pan, wherein the rack splash guard is in fluid communication with the drip pan such that the fluid received in the rack splash guard is directed into the drip pan.

17. The computing system of claim 14, wherein the abutment surface is disposed on a rack splash guard of the rack manifold.

* * * * *